(12) United States Patent
Johnson et al.

(10) Patent No.: US 6,288,900 B1
(45) Date of Patent: Sep. 11, 2001

(54) WARPAGE COMPENSATING HEAT SPREADER

(75) Inventors: Eric A. Johnson, Greene; Seungbae Park, Fishkill, both of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/453,124

(22) Filed: Dec. 2, 1999

(51) Int. Cl.[7] ....................................................... H05K 7/20
(52) U.S. Cl. .......................... 361/705; 165/80.2; 165/185; 174/16.3; 257/706; 257/713; 257/720; 361/718; 361/722; 361/710
(58) Field of Search .................. 165/80.2, 80.3, 165/185; 176/16.3; 257/707–706, 712–713, 720; 361/704–705, 707–708, 709–710, 717–718, 722

(56) References Cited

U.S. PATENT DOCUMENTS

| | | |
|---|---|---|
| 5,247,426 | 9/1993 | Hamburgen et al. . |
| 5,287,248 | 2/1994 | Montesano . |
| 5,537,342 | 7/1996 | Gainey . |
| 5,675,474 * | 10/1997 | Nagase et al. ................... 361/704 |
| 5,726,494 * | 3/1998 | Nashimoto et al. .................. 257/712 |
| 5,736,785 | 4/1998 | Chiang et al. . |
| 5,777,847 | 7/1998 | Tokuno et al. . |
| 5,831,826 | 11/1998 | Van Ryswyk . |

OTHER PUBLICATIONS

"Process Considerations in the Fabrication of Teflon Printed Circuit Boards", by Light et al, 1994 Proceedings, 44 Electronic Components & Technology Conference, 5/94.

"High Performance Carrier Technology: Materials and Fabrication", by Light et al, 1993 International Electronics Packaging Conference, San Diego, California, vol. One.

"High Performance Carrier Technology", by Heck et al, 1993 International Electronics Packaging Conference, San Diego, California, vol. One.

* cited by examiner

Primary Examiner—Gregory Thompson
(74) Attorney, Agent, or Firm—Salzman & Levy; Lawrence R. Fraley

(57) ABSTRACT

A heat spreading cap is placed over a chip or integrated circuit. The cap is shaped or sized to provide a distinct heat spreading and/or stiffness characteristic that differs as it extends into different regions of the module. The areas of differing stiffness or CTE reduce the warpage (or bending) of the module, thereby reducing the overall stress in the BGA.

24 Claims, 6 Drawing Sheets

WARPAGE COMPENSATING HEAT SPREADER

FIELD OF THE INVENTION

The invention relates to flip-chip, ball grid array (BGA) packages whose improved thermal and mechanical design improves their reliability.

BACKGROUND OF THE INVENTION

In the manufacture of plastic ball grid array (PBGA) packages, a chip is electrically and mechanically attached to a laminated, organic substrate. The thermal expansion of the material of the chip is not usually compatible with that of the organic laminate material. The mismatch in coefficients of thermal expansion (CTE) and contraction causes the module to warp, and leads to fatigue failure of the BGA.

In order to maintain the flatness of a PBGA package, especially those with a flip-chip, the chip may be overlaid with a heat spreading cap, which has been designed to balance the CTE and stiffness of the substrate that is disposed on the opposite side of the chip. However, the heat spreading cap has been only partially successful in maintaining flatness because it correctly balances the substrate only directly above the chip.

Another source of package warping has been determined to be the epoxy adhesive that cements the chip and cap to the substrate. The epoxy adhesive, which extends beyond the periphery of the cap, may not match the CTE of the substrate. Also, it has been observed that the epoxy tends to absorb and desorb moisture, causing additional expansion and contraction and consequent warpage of the module.

The present invention represents means by which the combined thermal mismatches between the chip, cap, adhesive, and laminated substrate can be overcome to maintain flatness over the operating temperature range, thereby increasing the fatigue life of the BGA.

The current inventors seek to vary the thickness, shape, or materials of the cap where it extends beyond the periphery of the chip. This variation in thickness, material, or shape resolves the mismatch problem by changing either the stiffness, the thermal expansion, or both, in the affected regions. The objective can also be achieved by the introduction of holes, grooves, and multiple materials in the cap(s).

Holes, fins, or separating borders may be fabricated by drilling, punching, shaping, etching, etc. to vary the stiffness.

The methods of the invention have been found to significantly reduce module warpage and to increase the fatigue life of the BGA while maintaining good heat dissipation, thus providing a structurally reliable module.

DISCUSSION OF RELATED ART

In U.S. Pat. No. 5,287,248, issued to Montesano, on Feb. 15, 1994 for METAL MATRIX COMPOSITE HEAT TRANSFER DEVICE AND METHOD, a construction is shown that conducts heat from a heat source to a heat sink. Thermal conduction is improved for mounting boards that support heat generating components.

In U.S. Pat. No. 5,247,426, issued on Sep. 21, 1993 to Hamburgen et al for SEMICONDUCTOR HEAT REMOVAL APPARATUS WITH NON-UNIFORM CONDUCTANCE, an apparatus for removing heat from a semiconductor is illustrated. The apparatus features different regions of high and low thermal conductance.

In U.S. Pat. No. 5,537,342, issued to Gainey on Jul. 16, 1996 for ENCAPSULATION OF ELECTRONIC COMPONENTS, an electronic device is shown for reducing stress. The device features an encapsulating member comprising a sandwich of two premolded parts.

In U.S. Pat. No. 5,736,785, issued on Apr. 7, 1998 to Chiang et al for SEMICONDUCTOR PACKAGE FOR IMPROVING THE CAPABILITY OF SPREADING HEAT, a heat spreading device is shown that is attached to a die. The die is supported by a substrate comprising a conductive pad for connection to a solder ball.

In U.S. Pat. No. 5,777,847, issued on Jul. 7, 1998 to Tokuno et al for MULTICHIP MODULE HAVING A COVER WITH SUPPORT PILLAR, a multichip is shown that comprises a substrate supporting a plurality of circuit chips. A cover plate covers semiconductor chips that are attached to a substrate.

In U.S. Pat. No. 5,831,826, issued to Van Ryswyk on Nov. 3, 1998 for HEAT TRANSFER APPARATUS SUITABLE FOR USE IN A CIRCUIT BOARD ASSEMBLY, a heat transfer apparatus is illustrated. The heat transfer apparatus is carried upon a substrate supporting a plurality of pads that connect to electronic components.

SUMMARY OF THE INVENTION

In accordance with the present invention, there is provided a module having a substrate upon which at least one chip or integrated circuit is mounted. A heat spreading cap is disposed over each chip or integrated circuit. The cap is shaped or sized to provide distinct combinations of stiffness and CTE in at least two areas. The configuration of the cap changes as it extends beyond the periphery of the chip.

It is an object of this invent ion to provide an electronic module with longer BGA fatigue life and less warpage.

It is another object of the invention to provide an electronic module having relatively low thermal resistance.

BRIEF DESCRIPTION OF THE DRAWINGS

A complete understanding of the present invention may be obtained by reference to the accompanying drawings, when considered in conjunction with the subsequent detailed description, in which.

For purposes of clarity and brevity, like components and elements will bear the same numbering and designations throughout the figures.

DESCRIPTION OF THE PREFERRED EMBODIMENT

Generally speaking, the invention features a module having a substrate upon which a chip or integrated circuit is mounted. A heat spreading cap is disposed over the chip or integrated circuit on the surface opposite to that of the substrate. The cap is shaped or sized to provide distinct combinations of CTE and stiffness in different regions of the module.

Figure 1:
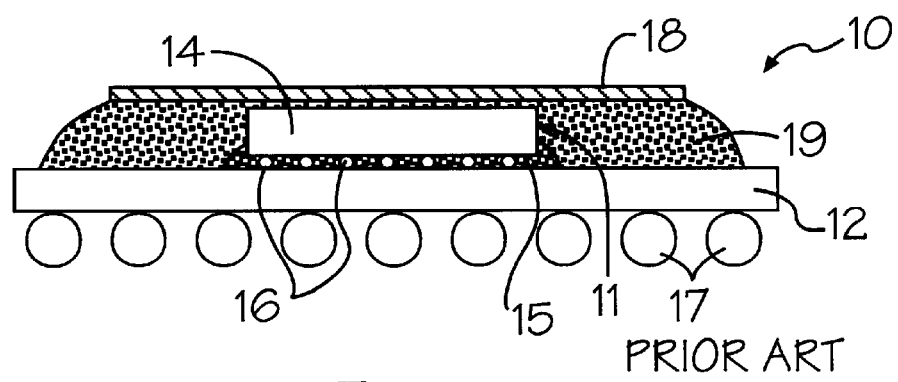
FIG. 1 illustrates a sectional view of a prior art electronic package.

Now referring to FIG. 1, a sectional view of a prior art electronic circuit module 10 is illustrated. The module 10 comprises a substrate 12 upon which a chip 14 is mounted by means of solder balls 16 that are disposed within the underfill material 15. The module 10 is itself mountable by solder balls 17.

A heat spreader or cap 18 is mounted on top of the chip 14 in order to dissipate heat and counter-balance the forces exerted by the thermal mismatch between the chip 14 and the substrate 12. The cap 18 is attached to the chip and substrate by means of encapsulant 19, which is usually an epoxy. The cap 18 is designed to counter-balance the forces that arise from the thermal mismatch between the substrate 12 and the chip 14. However, the counter-balancing cannot be achieved in entire module 20 with a homogeneous and uniform thick cap 18.

Figure 2:
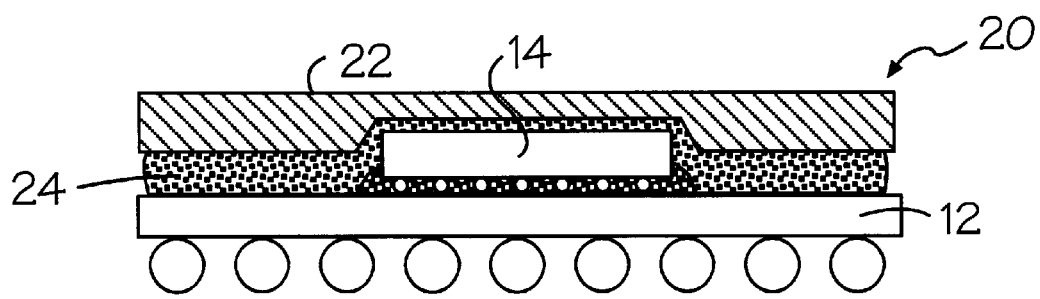
FIG. 2 shows a sectional view of a first embodiment of the improved electronic package of this invention.

Referring to FIG. 2, a sectional view of a first embodiment of the module 20 of this invention is shown. The inventive device is shaped and sized to reduce the aforementioned warpage inherent in the prior art design shown in FIG. 1. The heat spreading cap 22 is designed with a first thickness above the chip that balances the stiffness and expansion of the substrate disposed on the opposite side of the chip 14. A second thickness is used beyond the periphery of the chip 14 to balance the composite structure in this region. An upper, substantially flat surface is obtained, to which a heat sink, not shown, may be attached. It should be understood that the heat spreader can be disposed above the chip, covering a portion of the chip, extending beyond the periphery of the chip, or disposed entirely beyond the periphery of the chip, as variously shown in the remaining FIGURES.

Figure 3:
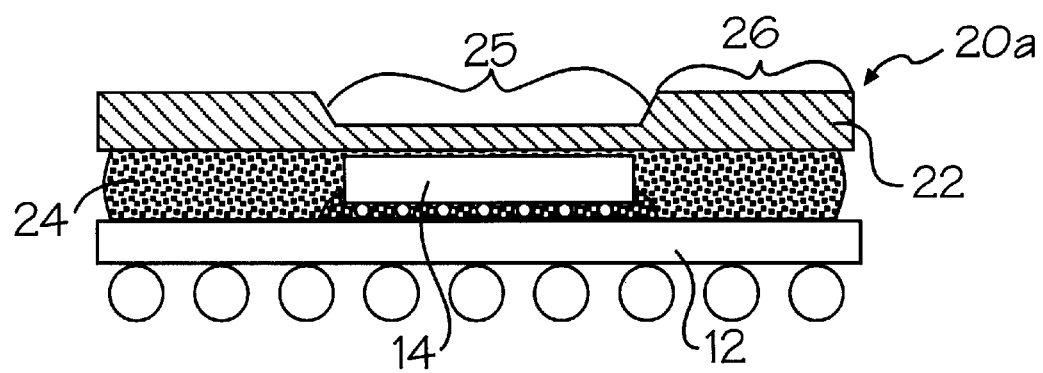
FIG. 3 depicts a sectional view of a second embodiment of the electronic package shown in FIG. 2.

Referring to FIG. 3, a second embodiment 20a of the module 20 shown in FIG. 2 is illustrated. The heat spreading cap 22 is configured with a mid-section 25 and a peripheral section 26.

Figure 4:
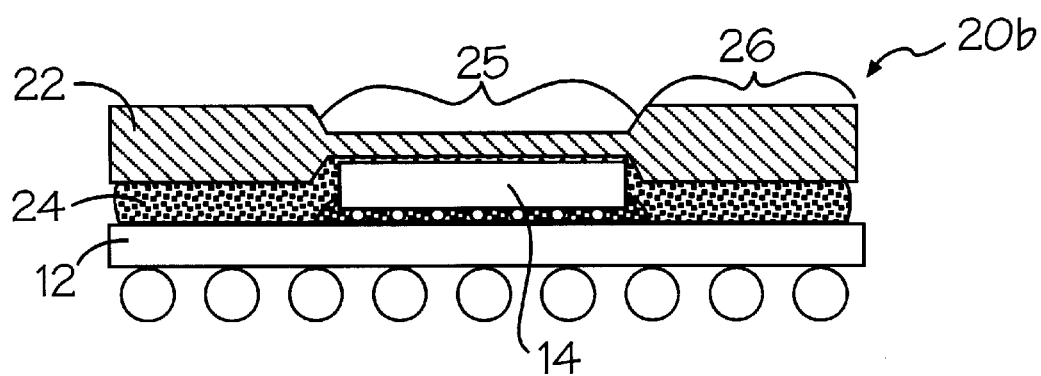
FIG. 4 illustrates a sectional view of a third embodiment of the electronic package shown in FIG. 2.

Referring to FIG. 4, a third embodiment 20b of the module 20 depicted in FIG. 2 is shown. It will be observed that the peripheral cap section 26 is built up above and below the mid-section 25. All of the foregoing three embodiments shown, respectively, in FIGS. 2, 3 and 4 achieve flatness by varying the stiffness with a thickness change alone.

Figure 5:
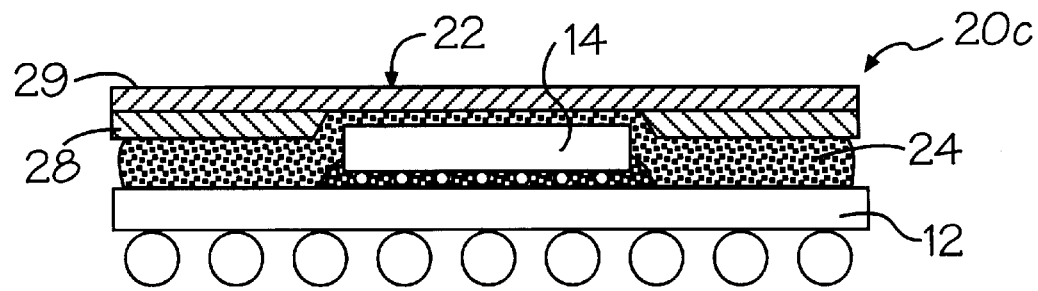
FIG. 5 shows a sectional view of a fourth embodiment of the electronic package depicted in FIG. 2.

Referring to FIG. 5, a fourth embodiment 20c of the module 20 illustrated in FIG. 2 is shown. It will be observed that the cap 22 is now composed of two different material layers 28 and 29, respectively. Thus, both stiffness and CTE are adjusted in this embodiment as well as in the embodiments depicted in FIGS. 6 and 7, described below.

Figure 6:
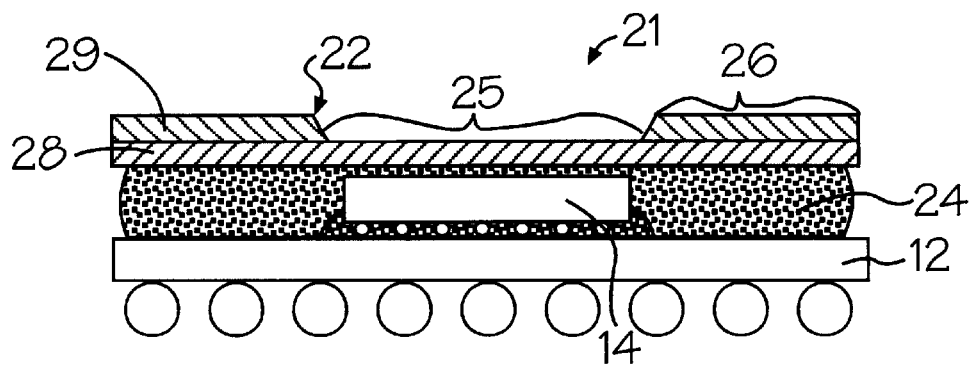
FIG. 6 depicts a sectional view of a second embodiment of the electronic package shown in FIG. 5.

Referring to FIG. 6, a second embodiment 21 of the module 20c shown in FIG. 5 is illustrated. The cap 22 is now shown having a mid-section 25 and a peripheral section 26, which is similar to the cap 22 shown in FIG. 3. However, the cap 22 now comprises two different materials, 28 and 29, as shown in FIG. 5. It should be understood that the heat spreader can be disposed above the chip, covering a portion of the chip, extending beyond the periphery of the chip, or disposed entirely beyond the periphery of the chip, as variously shown in the remaining FIGURES.

Figure 7:
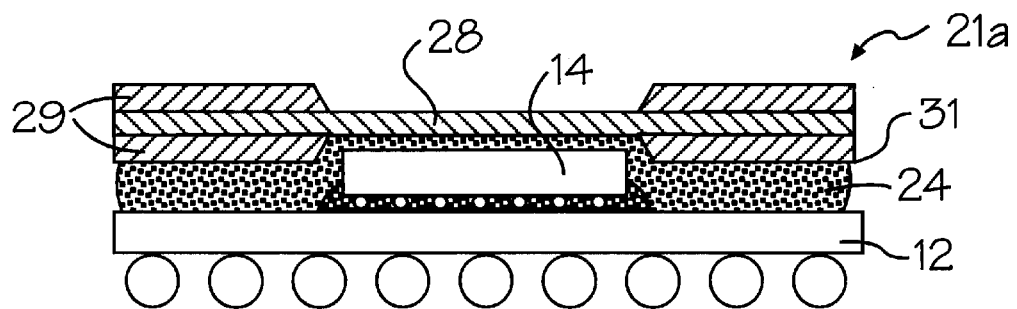
FIG. 7 illustrates a sectional view of a third embodiment of the electronic package depicted in FIG. 5.

Referring to FIG. 7, a third embodiment 21a of the module 20c shown in FIG. 5 is depicted. It will be observed that the cap 22 can now comprise three different materials 29, 28, and 30, respectively, as shown on the righthand side of the FIGURE. Alternatively, two material layers 29 can sandwich the middle material 28, as shown on the lefthand side of the FIGURE.

Figure 8:
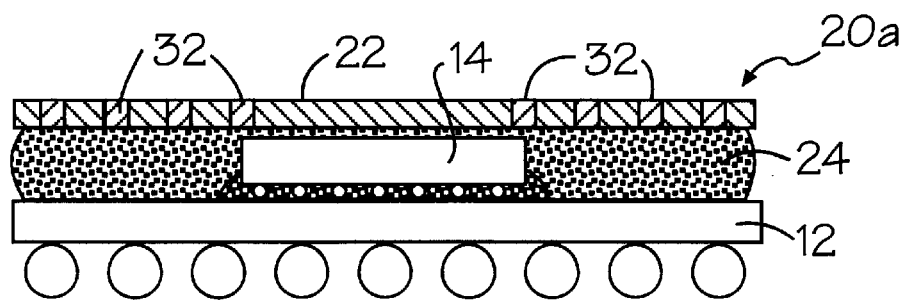
FIG. 8 shows a sectional view of a fifth embodiment of the electronic package illustrated in FIG. 2.

Referring to FIG. 8, a fifth embodiment 20d is shown of the module 20 illustrated in FIG. 2. In this embodiment, the heat spreading layer 22 comprises a plurality of holes or grooves 32. The holes or grooves 32 are filled with encapsulant 24 during assembly, thereby aiding adhesion.

Figure 9:
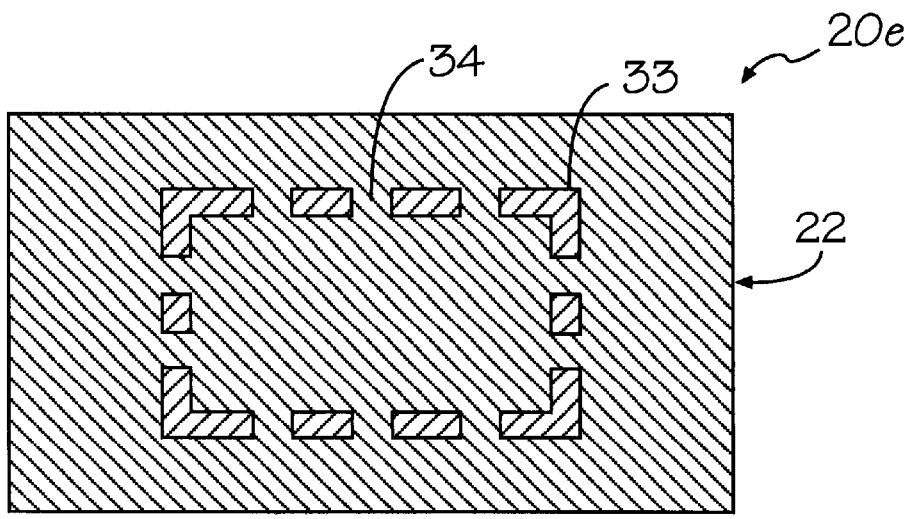
FIG. 9 depicts a plan view of a sixth embodiment of the electronic package shown in FIG. 2.

Referring to FIG. 9, a plan view of a sixth embodiment 20e of the electronic package 20 illustrated in FIG. 2 is shown. It will be observed that the heat spreading layer 22 is configured with a staggered border 33. The staggered border 33 comprises holes 34 that form a discontinuous rectangle in the spreading layer 22.

Figure 10:
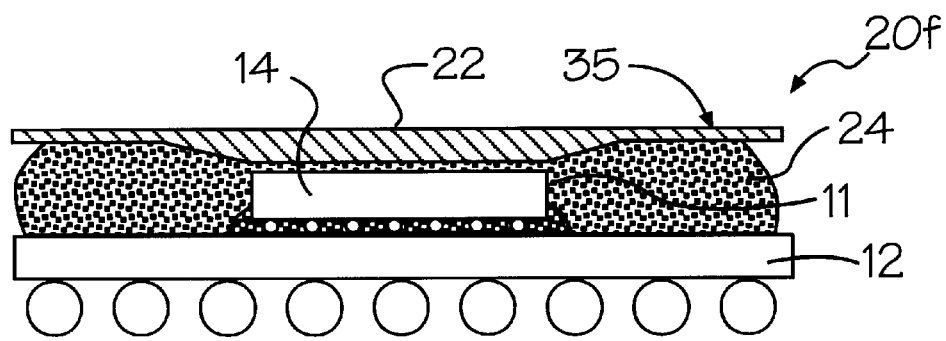
FIG. 10 illustrates a sectional view of a seventh embodiment of the electronic package depicted in FIG. 2.

Referring to FIG. 10, a sectional view of a seventh embodiment 20f of the electronic package shown in FIG. 2 is illustrated. It will be noted that the heat spreading layer 22 is now tapered upwardly in the outer region 35 that extends beyond the chip periphery 11.

Figure 11:
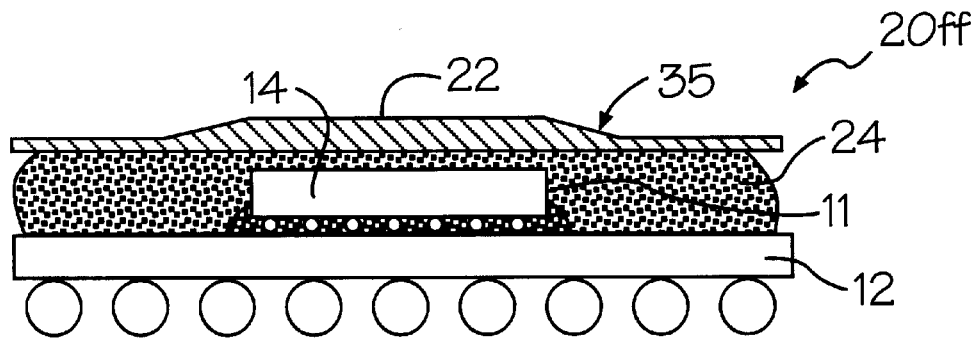
FIG. 11 shows a sectional view of a second embodiment of the electronic package illustrated in FIG. 10.

Referring to FIG. 11, a sectional view of a second embodiment 20ff of the electronic package 20f illustrated in FIG. 10 is shown. It will be noted that the heat spreading layer 22 is now tapered downwardly in the outer region 35 that extends beyond the chip periphery 11.

Figure 12:
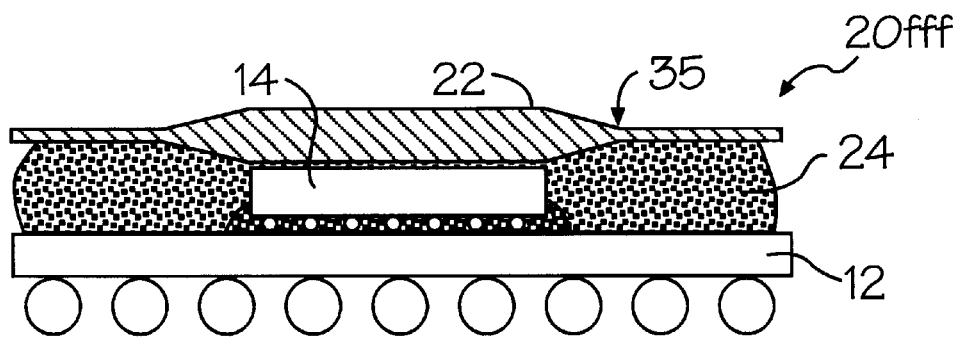
FIG. 12 illustrates a sectional view of a third embodiment of the electronic package shown in FIG. 10.

Referring to FIG. 12, a sectional view of a third embodiment 20fff of the electronic package 20f shown in FIG. 10 is illustrated. It will be noted that the heat spreading layer 22 is now tapered both upwardly and downwardly in region 35, as it extends beyond the chip periphery 11.

Figure 13:
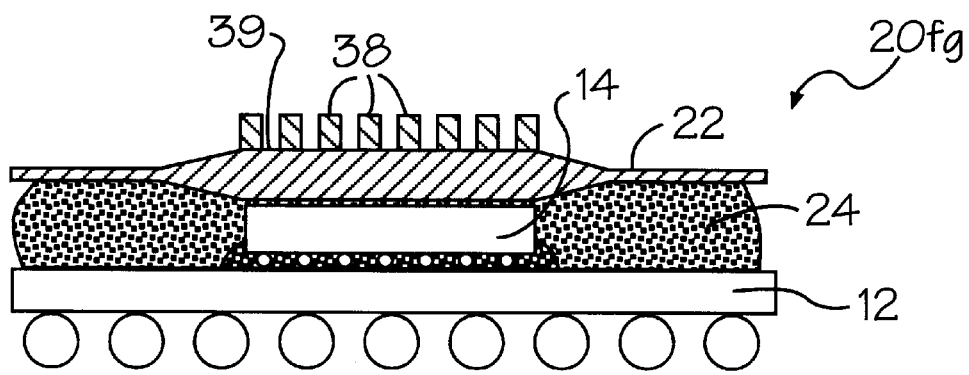
FIG. 13 depicts a sectional view of a second embodiment of the electronic package shown in FIG. 12.

Referring to FIG. 13, a sectional view of a second embodiment 20fg of the electronic package 20fff shown in FIG. 12 is shown. It will be observed that the heat spreading layer 22 has a number of heat dissipating fins 38 disposed upon its upper surface 39.

Figure 14:
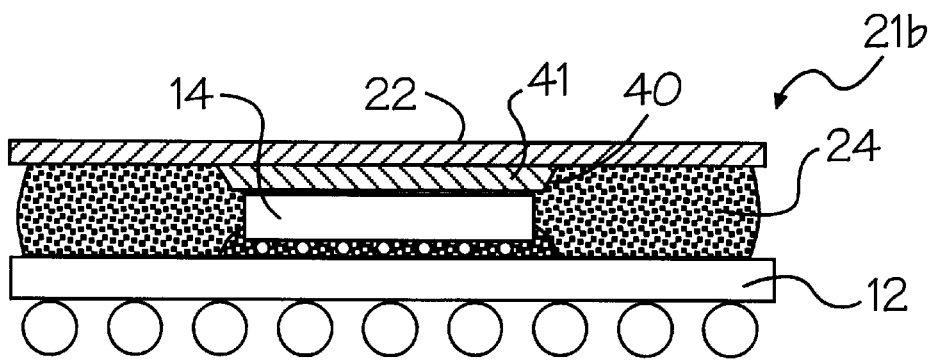
FIG. 14 shows a sectional view of a fourth embodiment of the electronic package depicted in FIG. 5.

Referring to FIG. 14, a sectional view of a fourth embodiment 21b of the electronic package 20c depicted in FIG. 5 is illustrated. Heat spreading cap 22 is shown comprising two different layers 40 and 41, respectively. Layer 41 is disposed directly over the chip 14, and comprises a different material than that of the extended layer 40.

Figure 15:
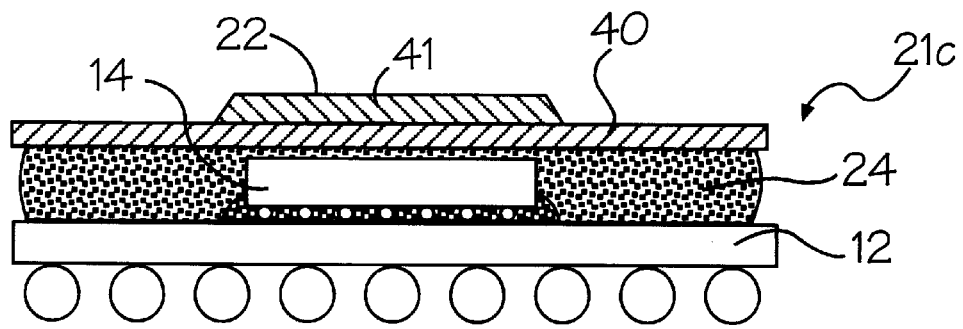
FIG. 15 illustrates a sectional view of a fifth embodiment of the electronic package depicted in FIG. 5.

Referring to FIG. 15, a sectional view of a fifth embodiment 21c of the electronic package 20c depicted in FIG. 5 is illustrated. Heat spreading cap 22 is shown comprising two different layers 40 and 41, respectively. Layer 41 is disposed directly over the chip 14 and above layer 40, which extends beyond the chip region.

Figure 16:
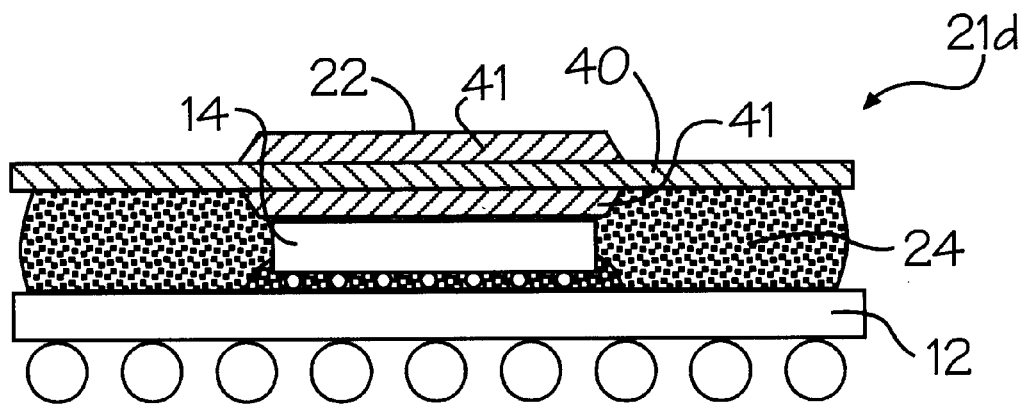
FIG. 16 depicts a sectional view of a sixth embodiment of the electronic package shown in FIG. 5.

Referring to FIG. 16, a sectional view of a sixth embodiment 21d of the electronic package 20c depicted in FIG. 5 is illustrated. Heat spreading cap 22 is shown comprised of three different layers. Two of the three layers comprise upper and lower layers 40 that sandwich layer 41. Layers 41 are disposed directly over the chip 14. Layer 40 extends beyond the chip region. Layers 41 can be of the same material or of different materials. The material(s) of layer(s) 41 are different than the material in layer 40.

Figure 17:
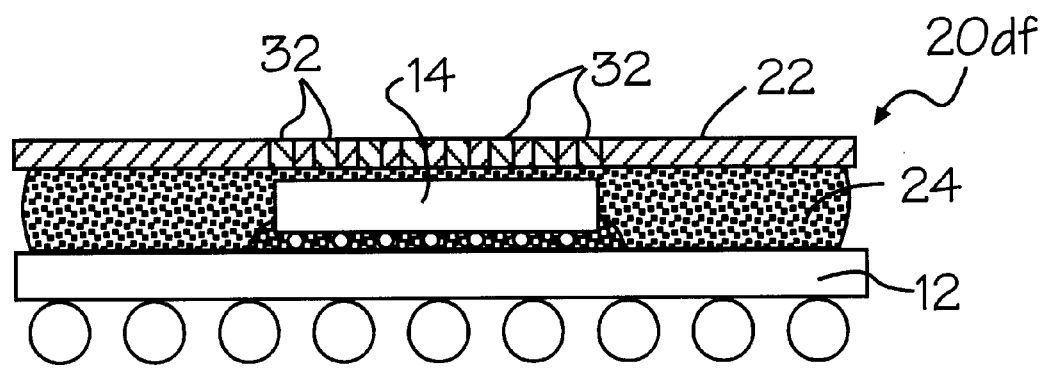
FIG. 17 illustrates a sectional view of a second embodiment of the electronic package depicted in FIG. 8.

Referring to FIG. 17, a sectional view of a second embodiment 20df of the electronic package 20d depicted in FIG. 8 is shown. It will be observed that the plurality of holes 32 is now disposed directly over chip 14.

Since other modifications and changes varied to fit particular operating requirements and environments will be apparent to those skilled in the art, the invention is not considered limited to the example chosen for purposes of disclosure, and covers all changes and modifications which do not constitute departures from the true spirit and scope of this invention.

Having thus described the invention, what is desired to be protected by Letters Patent is presented in the subsequently appended claims.

What is claimed is:

1. An electronic package, comprising:

a chip or integrated circuit disposed upon an organic, laminated substrate, and bonded thereto by solder balls; and a heat spreader disposed over said chip or integrated circuit and extending beyond a periphery of said chip or integrated circuit, said heat spreader comprising sections having relatively different coefficients of thermal expansion and contraction, whereby warpages in said electronic package are reduced.

2. The electronic package in accordance with claim 1, wherein said heat spreader comprises at least one layer having a different thickness section extending beyond a periphery of said chip.

3. The electronic package in accordance with claim 2, wherein said at least one layer covers at least a portion of said chip.

4. The electronic package in accordance with claim 2, wherein said at least one layer is disposed beyond a periphery of said chip.

5. The electronic package in accordance with claim 1, wherein said heat spreader comprises at least two layers having different materials.

6. The electronic package in accordance with claim 1, wherein said heat spreader comprises at least one layer having a tapered shape extending beyond a periphery of said chip.

7. The electronic package in accordance with claim 1, wherein said heat spreader comprises a layer of material having holes.

8. The electronic package in accordance with claim 1, wherein said heat spreader comprises a layer of material having a border.

9. The electronic package in accordance with claim 1, wherein said heat spreader comprises a layer of material having heat dissipating fins.

10. An electronic package, comprising:

a chip or integrated circuit disposed upon and bonded to an organic, laminated substrate by solder balls; and a heat spreader disposed over, and extending past a periphery of said chip or integrated circuit and comprising sections having relatively different stiffness whereby warpages in said electronic package are reduced by balancing the stiffness and the coefficient of thermal expansion of the substrate independently above said chip and beyond said periphery thereof.

11. The electronic package in accordance with claim 10, wherein said heat spreader comprises at least one layer having a different thickness section extending beyond a periphery of said chip.

12. The electronic package in accordance with claim 11, wherein said at least one layer covers at least a portion of said chip.

13. The electronic package in accordance with claim 11, wherein said at least one layer is disposed beyond a periphery of said chip.

14. The electronic package in accordance with claim 10, wherein said heat spreader comprises at least two layers having different materials.

15. The electronic package in accordance with claim 10, wherein said heat spreader comprises at least one layer having a tapered shape extending beyond a periphery of said chip.

16. The electronic package in accordance with claim 10, wherein said spreader comprises a layer of material having holes.

17. The electronic package in accordance with claim 10, wherein said heat spreader comprises a layer of material having a border.

18. The electronic package in accordance with claim 10, wherein said heat spreader comprises a layer of material having heat dissipating fins.

19. An electronic package, comprising:

a chip or integrated circuit disposed upon, and bonded by solder balls to and organic substrate; and a heat spreader disposed over, and extending past a periphery of said chip or integrated circuit and comprising at least two layers of different materials, at least one of said layers of different materials extending beyond said periphery of said chip, whereby warpages in said electronic package are reduced.

20. The electronic package in accordance with claim 19, wherein said at least one of said layers of different materials covers at least a portion of said chip.

21. The electronic package in accordance with claim 19, wherein said at least one of said layers of different materials is disposed beyond a periphery of said chip.

22. The electronic package in accordance with claim 19, wherein one of said at least two layers is disposed directly above said chip.

23. The electronic package in accordance with claim 19, wherein said at least two layers comprises a sandwich of one material layer disposed between two layers of another material.

24. The electronic package in accordance with claim 19, wherein said at least two layers comprise three layers of different materials.

* * * * *